United States Patent

Wilson

[11] 4,052,367
[45] Oct. 4, 1977

[54] RADIATION SENSITIVE POLYMERS OF OXYGEN-SUBSTITUTED MALEIMIDES AND ELEMENTS CONTAINING SAME

[75] Inventor: John Charles Wilson, Rochester, N.Y.

[73] Assignee: Eastman Kodak Company, Rochester, N.Y.

[21] Appl. No.: 621,728

[22] Filed: Oct. 14, 1975

[51] Int. Cl.² ............................................. C08F 26/06
[52] U.S. Cl. .............................. 260/63 UY; 96/35.1; 204/159.14; 260/30.4 N; 260/32.6 N; 260/32.8 N; 260/33.6 UA; 260/33.8 UA; 260/47 UA; 260/73 R; 428/500; 526/218; 526/258; 526/263
[58] Field of Search .................... 260/63 UY, 47 UA; 526/258, 264

[56] References Cited
U.S. PATENT DOCUMENTS

| | | | |
|---|---|---|---|
| 3,471,458 | 10/1969 | Mehmedbasich | 526/258 |
| 3,480,598 | 11/1969 | Neild | 526/258 |
| 3,957,732 | 5/1976 | Hirooka et al. | 526/258 |

Primary Examiner—Harry Wong, Jr.
Attorney, Agent, or Firm—Arthur H. Rosenstein

[57] ABSTRACT

Radiation sensitive polymers comprising:
A. from about 1 to 100 mole percent of a polymerized monomer having the formula

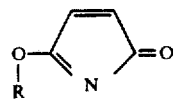

wherein R is a hydrocarbon group having from 2 to 20 carbon atoms, preferably a bridged hydrocarbon group having from 6 to 10 carbon atoms; and B. from 0 to about 99 mole percent of at least one additional polymerized ethylenically unsaturated monomer are advantageously soluble in organic solvents, possess desirably high glass transition temperatures and are capable of undergoing a photochemical reaction to yield polymers having isocyanate and oxy-substituted cyclopropane moieties which are capable of crosslinking in the presence of active hydrogen-containing compounds. The polymers are useful in radiation sensitive compositions and elements containing same.

6 Claims, No Drawings

RADIATION SENSITIVE POLYMERS OF OXYGEN-SUBSTITUTED MALEIMIDES AND ELEMENTS CONTAINING SAME

BACKGROUND OF THE INVENTION

1. Field of the Invention

This invention relates to organic materials which are useful in the photographic field. In particular, this invention relates to radiation sensitive polymeric organic materials, which can be incorporated into radiation sensitive elements, such as photoresists, to obtain a desirable combination of properties. These polymeric materials are homopolymers or interpolymers comprising oxygen-substituted maleimides, prepared by free radical-initiated addition polymerization.

2. Description of the Prior Art

Applicant has found no art which teaches or suggests the present invention. Schwartz et al report in *J. Org. Chem*, Vol. 39 (1), pp. 21–23 (1974) the synthesis of an O-substituted maleimide. The specific compound prepared was 0-(1-adamantyl) maleimide, or preferably named as 5-(1-adamantyloxy)-2H-pyrrole-2-one. However, this article does not teach or suggest polymerization of this material or consider any potential polymeric applications.

Several researchers have reported on the photochemical reactivity of keto imine ethers and have postulated mechanisms for such reactivity, notably Koch et al in *Tetrahedron Letters*, No. 27, pp. 2391–2393 (1970); No. 39, pp. 4035–4038 (1972); and *J. Amer. Chem. Soc.*, Vol. 95 (12), pp. 3957–3963 (1973). The photo initiated rearrangement of keto imino ethers to the corresponding isocyanates is thought to proceed by the following mechanism:

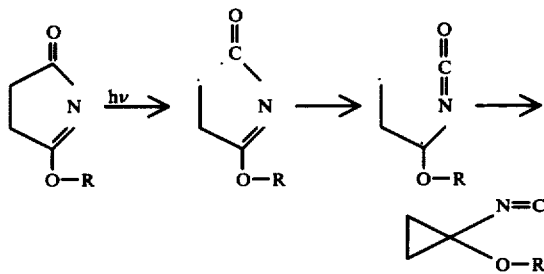

None of these articles suggest the polymerization of such keto imino ethers to form polymers which are selectively soluble in organic solvents after irradiation with light.

SUMMARY OF THE INVENTION

One aspect of the present invention comprises a radiation sensitive polymer comprising from about 1 to 100 mole percent of a polymerized monomer having the formula

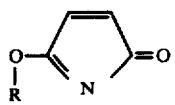

wherein R is a hydrocarbon group having from 2 to 20 carbon atoms, preferably a bridged hydrocarbon group having from 6 to 10 carbon atoms; and from 0 to about 99 mole percent of at least one additional polymerized ethylenically unsaturated monomer.

In another aspect of the present invention, a crosslinkable polymer comprises from about 1 to 100 mole percent of a polymerized monomer having the formula

wherein R is a hydrocarbon group having from 2 to 20 carbon atoms, preferably a bridged hydrocarbon group having from 6 to 10 carbon atoms; and from 0 to about 99 mole percent of at least one additional polymerized ethylenically unsaturated monomer.

In a further aspect of the present invention, a process for preparing a crosslinkable polymer comprising:

A. from about 1 to 100 mole percent of a polymerized monomer having the formula

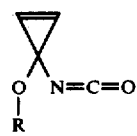

wherein R is a hydrocarbon group having from 2 to 20 carbon atoms, preferably a bridged hydrocarbon group having from 6 to 10 carbon atoms; and B. from 0 to about 99 mole percent of at least one additional polymerized ethylenically unsaturated monomer, comprises the step of exposing to light a radiation sensitive polymer comprising:

A. from about 1 to 100 mole percent of a polymerized monomer having the formula

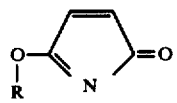

wherein R is a hydrocarbon group having from 2 to 20 carbon atoms, preferably a bridged hydrocarbon group having from 6 to 10 carbon atoms; and B. from 0 to about 99 mole percent of at least one additional polymerized ethylenically unsaturated monomer.

In still another aspect of the present invention, a radiation sensitive element comprises a support having coated thereon at least one radiation sensitive layer comprising a radiation sensitive polymer comprising from about 1 to 100 mole percent of a polymerized monomer having the formula

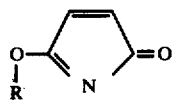

wherein R is a hydrocarbon group having from 2 to 20 carbon atoms, preferably a bridged hydrocarbon group having from 6 to 10 carbon atoms; and from 0 to about 99 mole percent of at least one additional polymerized ethylenically unsaturated monomer.

In a further aspect of the present invention, a photographic element comprises a support having coated thereon at least one layer comprising a crosslinkable polymer comprising from about 1 to 100 mole percent of a polymerized monomer having the formula

wherein R is a hydrocarbon group having from 2 to 20 carbon atoms, preferably a bridged hydrocarbon group having from 6 to 10 carbon atoms; and from 0 to about 99 mole percent of at least one additional polymerized ethylenically unsaturated monomer.

Still another aspect of the present invention comprises a process for preparing a photomechanical image which comprises (1) exposing to actinic radiation an improved radiation sensitive element comprising a support having coated thereon an organic solvent soluble radiation sensitive composition in combination with a poly active hydrogen containing moiety; said exposure rendering the exposed areas of said composition insoluble in organic solvent; and (2) developing an image by removing the unexposed areas of the radiation sensitive composition with an organic solvent, the improvement comprising the incorporation into the element of a radiation sensitive polymer comprising from about 1 to 100 mole percent of a polymerized monomer having the formula

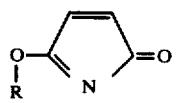

wherein R is a hydrocarbon group having from 2 to 20 carbon atoms, preferably a bridged hydrocarbon group having from 6 to 10 carbon atoms; and from 0 to about 99 mole percent of at least one additional polymerized ethylenically unsaturated monomer.

The novel polymers of the present invention are advantageously soluble in organic solvents particularly halogenated solvent, thereby rendering them useful in radiation sensitive elements where selective solubility is necessary for forming photomechanical images, such as in photoresists, lithographic plates, etc. The present polymers have inherent viscosities in the range of about 0.2 to 3.0 and possess desirably high glass transition temperatures greater than about 200° C upon second heating.

In addition, the radiation sensitive polymers of the present invention have been found to undergo a photochemical reaction to yield polymers containing isocyanate and oxysubstituted cyclopropane moieties which are easily crosslinked in the presence of a poly(active hydrogen) containing compound.

Accordingly, one object of the present invention is to provide novel, radiation sensitive polymers which have desirably high glass transition temperatures and are soluble in organic solvents.

Another object is to provide radiation sensitive elements comprising novel radiation sensitive polymers which are easily crosslinked by exposure to light in the presence of poly(active hydrogen) containing compounds.

Still another object is to provide an improved process for preparing photomechanical images useful in the graphic arts.

The above and additional objects of the present invention will become apparent to those having ordinary skill in the art from the further description of this invention which follows:

DESCRIPTION OF THE PREFERRED EMBODIMENTS

In one aspect of this invention, a radiation sensitive polymer comprises:

A. from about 1 to 100 mole percent of a polymerized monomer having the formula

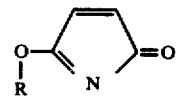

wherein R is a hydrocarbon group having from 2 to 20 carbon atoms, such as alkyl including ethyl, propyl, butyl, pentyl, hexyl, heptyl and the like; cycloalkyl including cyclopropane, cyclobutane, cyclopentane, cyclohexane and the like; and aryl including phenyl, naphthyl and the like and bridged hydrocarbon groups having from 6 to 10 carbon atoms. The hydrocarbon group may be substituted with substituents which do not detrimentally affect the properties of the polymers of the present invention.

In all aspects of this invention, bridged hydrocarbon groups having from 6 to 10 carbon atoms include saturated or unsaturated hydrocarbon compounds having one or more cabon rings and one or more carbon bridges. Exemplary of such compounds useful in the present invention are bicyclo8 3.1.0]hexane, tricyclo[4.22.0]-deca-7,9-diene, bornane, norbornane, adamantane, and the like.

In a preferred embodiment of the present invention, the radiation sensitive polymer as described above comprises A. from about 1 to 100 mole percent of a polymerized monomer having the formula

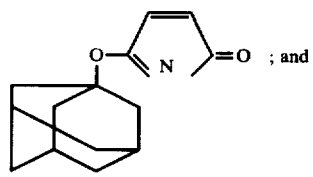

B. from 0 to about 99 mole percent of at least one additional polymerized ethylenically unsaturated monomer.

A particularly useful monomer containing a bridged hydrocarbon group is 5-(1-adamantyloxy)-2H-pyrrole-2-one.

This monomer can be polymerized to advantage with itself or with up to 99 mole percent of at least one additional polymerized ethylenically unsaturated monomer. As exemplary of such monomers may be listed: acrylamide, methacrylamide, N-isopropylacrylamide, N-(1,1-dimethyl-3-dimethylaminopropyl)-acrylamide, and other vinyl carboxamides; methacrylonitrile, acrylonitrile and other vinyl nitriles; acrylic acid, methacrylic acid, (m- and p-vinylphenyl) acetic acid, m- and p-vinylbenzoic acid, 3-acrylamido-3-methylbutanoic acid and other unsaturated carboxylic acids; 2-hydroxyethyl methacrylate, 2-hydroxyethyl acrylate, 2-hydroxypropyl acrylate, 2-hydroxypropyl methacrylate and other hydroxyalkyl acrylates and methacrylates; p-methylsulfonamidostyrene, and other vinylsulfonamides; sodium 3-methacryloyloxypropane-1-sulfonate, sodium 3-acryloyloxypropane-1-sulfonate, sodium 4-acryloyloxybutane-2-sulfonate, 3-methyl-1-vinylimidazolium methosulfate, 1,2-dimethyl-5-vinylpyridinium methosulfate and others as described in Dykstra, U.S. Pat. No. 3,441,911 issued Nov. 19, 1968; alkyl acrylates and methacrylates such as methyl acrylate, methyl methacrylate, ethyl acrylate, ethyl methacrylate, n-butyl acrylate, n-butyl methacrylate, etc.; styrene and substituted styrenes such as α-methylstyrene p-bromostyrene, p-t-butylstyrene, vinyltoluene, etc.; vinyl ketones, such as methyl vinyl ketone, etc.; vinyl halides, such as vinyl chloride, vinylidene chloride, etc.; vinyl ethers, such as methyl vinyl ether, etc.; olefins and diolefins such as butadiene, isoprene, ethylene etc.

Examples of polymers useful herein include a homopolymer of 5-(1-adamantyloxy)-2H-pyrrole-2-one; a copolymer of 5-(1-adamantyloxy)-2H-pyrrole-2-one(10-90 mole percent) and styrene (90-10 mole percent); a copolymer of 5-(1-adamantyloxy)-2H-pyrrole-2-one (20–80 mole percent) and methyl methacrylate (80-20 mole percent); a copolymer of 5-(1-adamantyloxy)-2H-pyrrole-2-one (50 mole percent) and 2-hydroxyethyl methacrylate (50 mole percent); a copolymer of 5-(1-adamantyloxy)-2H-pyrrole-2-one (50 mole percent) and isobornyl methacrylate (50 mole percent); a copolymer of 5-(1-adamantyloxy)-2H-pyrrole-2-one (50 mole percent) and butyl methacrylate (50 mole percent); a copolymer of 5-(1-adamantyloxy)-2H-pyrrole-2-one (50 mole percent) and ethyl methacrylate (50 mole percent); a copolymer of 5-(1-adamantyloxy)-2H-pyrrole-2-one (50 mole percent) and acrylonitrile (50 mole percent); a copolymer of 5-(1-adamantyloxy)-2H-pyrrole-2-one (50 mole percent) and chloroethyl methacrylate (50 mole percent); and a copolymer of 5-(1-adamantyloxy)-2H-pyrrole-2-one (50 mole percent) and acrylamide (50 mole percent); a copolymer of 5-(1-adamantyloxy)-2H-pyrrole-2-one (50 mole percent) and methyl vinyl ketone (50 mole percent); and a terpolymer of 5-(1-adamantyloxy)-2H-pyrrole-2-one (50 mole percent), methyl methacrylate (30 mole percent) and 2-hydroxyethyl methacrylate (20 mole percent).

The molecular weights of the polymers of the present invention are subject to wide variation, but are often in the range of about 3000 to about 500,000. These polymers preferably have inherent viscosities (0.25 g polymer in 100 ml chloroform at 25° C) from 0.2 to 3.0, more preferably from about 0.4 to about 1.0. As used herein, the term "inherent viscosity" is determined by the formula $$\eta\text{inh} = \frac{2.30 \log \eta\text{rel}}{C}$$

wherein ηinh is the inherent viscosity, ηrel is the relative viscosity of chloroform solution of the polymer and C is the concentration in grams (0.25) of polymer per 100 cc of solution.

The glass transition temperatures (Tg), as used in this invention and set forth in this specification, unless otherwise specified, can be determined by differential scanning colorimetry as disclosed in "Techniques and Methods of Polymer Evaluation", Vol. 2, Marcel Dekker, Inc., N.Y. 1970. The glass transition temperatures of the oxygen-substituted maleimide polymers of the present invention report are determined upon second heating.

Polymerization of the polymers of this invention can usually be carried out as a solution polymerization in a suitable organic medium, for example, chloroform, dioxane, dimethyl sulfoxide, etc. using methods well known to those skilled in the art. The temperature at which the polymers described herein are prepared is subject to wide variation since this temperature depends upon such variable features as the specific monomer used, duration of heating, pressure employed and like considerations. However, the polymerization temperature generally does not exceed 110° C, and most often it is in the range of about 40 to about 100° C. The pressure employed in the polymerization is usually only sufficient to maintain the reaction mixture in liquid form, although either superatmospheric or subatmospheric pressures can be used where such use is advantageous. The concentration of polymerizable monomer in the polymerization mixture can be varied widely with concentrations up to about 80 percent by weight, and preferably from about 10 to about 50 percent by weight, based on the weight of the polymerization mixture.

Suitable catalysts for the addition polymerization reaction to provide the polymers of this invention, include, for example, from about 0.001 to about 2.0 percent by weight based on the total weight of polymerizable monomers, of free radical catalysts, such as hydrogen peroxide, benzoyl peroxide, acetyl peroxide, t-butylhydroperoxide, cumene hydroperoxide, azo type initiators, such as α,α-azo-diisobutyronitrile, azo-dicyclohexylcarbonitrile, and the like. In redox polymerization, conventional ingredients can be employed. If desired, the polymer can be isolated from the reaction vehicle by freezing, salting out, precipitation in a suitable non-solvent such as ethyl ether, or any other procedure suitable for this purpose.

Polymerizable monomers having the formula

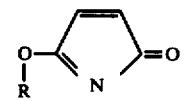

wherein R is a hydrocarbon group having from 2 to 20 carbon atoms, preferably a bridged hydrocarbon group having from 6 to 10 carbon atoms which are useful in making the polymers described herein, can be prepared according to the method of Schwartz and Lerner, J. Org. Chem., 39 (1), pp. 21-23 (1974). A silver maleimide and a bridged hydrocarbon halide, such as 1-bromoadamantane are reacted in a suitable solvent such as benzene, toluene and the like, at room temperature for 18 to 20 hours. The resulting products of the silver halide and the maleimide substituted at one of the oxygens with a bridged hydrocarbon can be separated by filtration and evaporation of the filtrate to dryness.

As indicated above, another aspect of the present invention is a crosslinkable polymer comprising:

A. from about 1 to 100 mole percent of a polymerized monomer having the formula

wherein R is a hydrocarbon group having from 2 to 20 carbon atoms, perferably a bridged hydrocarbon group as defined above having from 6 to 10 carbon atoms; and B. from 0 to about 99 mole percent of at least one additional polymerized ethylenically unsaturated monomer.

In a preferred embodiment of the present invention, R is a 1-adamantyl group in the crosslinkable polymers. These polymers are formed from the oxygen-substituted polymers described above upon exposure to actinic radiation such as ultraviolet light. Exposure to a xenon light flash, which is not rich in UV light, for as little as 62 μsec. from a distance of about 1 foot, is sufficient to affect conversion to the isocyanate moiety. Extended exposure, e.g., even over 16 hours, to a rich UV source, such as a 450 watt mercury vapor lamp at about 1 foot continues to increase the degree of conversion.

Also, as indicated above, still another aspect of the present invention is a radiation sensitive element comprising a support having coated thereon at least one radiation sensitive layer comprising a radiation sensitive polymer comprising A. from about 1 to 100 mole percent of a polymerized monomer having the formula

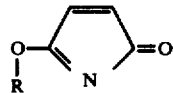

wherein R is a hydrocarbon group having from 2 to 20 carbon atoms, preferably a bridged hydrocarbon group as defined above having from 6 to 10 carbon atoms; and B. from 0 to about 99 mole percent of at least one additional polymerized ethylenically unsaturated monomer.

Another photographic element useful according to the present invention comprises a support having coated thereon at least one layer comprising a crosslinkable polymer comprising A. from about 1 to 100 mole percent of a polymerized monomer having the formula

wherein R is a hydrocarbon group having from 2 to 20 carbon atoms, preferably a bridged hydrocarbon group as defined above having from 6 to 10 carbon atoms; and B. from 0 to about 99 mole percent of at least one additional polymerized ethylenically unsaturated monomer.

Radiation sensitive compositions useful in the radiation sensitive elements of the present invention can be prepared by forming a solution of the radiation sensitive polymeric material of the present invention alone or mixed with a film forming non-radiation sensitive material such as polyesters, polyacetals, and the like. Generally a binder can comprise up to 99 percent by weight of the mixture. These compositions can then be used with poly(active hydrogen) containing compounds to form radiation sensitive elements such as resists or lithographic plates. By poly(active hydrogen) containing compounds, it is meant compounds that have two or more active hydrogen-containing moieties, such as amine, hydroxy-containing compounds and polymers, hydroxy-terminated polyesters and the like.

Preferred poly(active hydrogen) containing compounds are bis(active hydrogen) containing compounds which have two active hydrogen-containing moieties. Exemplary of such compounds are 1,4-bis(aminomethyl)cyclohexane, 2-(2-amino-ethylamino) ethanol, 2-[N,N-bis(2-aminoethyl)amino] ethanol, N,N'-bis[3-(2-aminoethylamino)propyl] ethylene diamine, 3,3'-diaminodipropylamine, diethylene triamine, ethylenediamine, 4-dodecyldiethylenetriamine, 1,6-hexanediamine, 1,8-menthanediamine, and other diamines; 2-amino-2-ethyl-1,3-propanediol, 1,3-butanediol, 1,4-butanediol, 1,2,4-butanetriol, 1,4-cyclohexanediol, 1,10-decanediol, ethylene glycol and other glycols. Though not wishing to be bound to a particular theory, it is believed that poly(active hydrogen) containing compounds react with isocyanates of the crosslinkable polymers described herein crosslinking the polymers and rendering them insoluble in organic solvents.

The isocyanate polymers of the present invention are useful in other than crosslinked form. They can be reacted with mono (active hydrogen) containing compounds to append a new moiety, such as a dye, to the polymer backbone. In light sensitive materials, the dye may be removed where not bonded to the polymer.

Another aspect of the present invention is an improved process for preparing a photomechanical image which comprises 1) exposing to actinic radiation an improved radiation sensitive element comprising a support having coated thereon an organic solvent soluble radiation sensitive composition comprising the polymer of the light sensitive material and a poly(active hydrogen) containing compound as defined above, thus rendering the exposed areas of said composition insoluble in organic solvent, the improvement comprising the incorporation into the element a radiation sensitive polymer as described hereinabove.

The solvents which can be employed as coating solvents in preparing compositions with the radiation sensitive polymers of the present invention are preferably organic solvents which may be selected from those which are capable of dissolving at least 0.2% by weight of the radiation sensitive materials employed but are unreactive toward the radiation sensitive materials employed and which are substantially incapable of attacking the substrates employed. Exemplary solvents include dimethylformamide, methylethyl ketone, methylene chloride, chloroform, 1,2-dichloroethane, carbon tetrachloride, tetrahydrofuran, dioxane, benzene, toluene, xylene and the like and mixtures of these solvents with each other. Preferred solvents are halogenated solvents such as chloroform, methylene chloride, etc.

The concentrations of radiation sensitive polymer in the coating solutions are dependent upon the nature of the radiation sensitive materials, the supports and the coating methods employed. Particularly useful coatings are obtained when the coating solutions contain from about 0.05 to about 25 percent by weight of radiation sensitive material.

It will be recognized that additional components can be included in the elements of the present invention. For example, dyes and/or pigments can be included to obtain colored images; resins, stabilizers and surface active agents may serve to improve film formation, coating properties, adhesion of coatings to the supports employed, mechanical strength, chemical resistance, etc.

Radiation sensitive elements bearing layers of the polymeric materials disclosed herein can be prepared by coating the radiation sensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylons, cellulose ester film base, e.g., cellulose nitrate, cellulose acetate, cellulose acetate propionate, cellulose acetate butyrate, and the like. The supports, and especially polymeric supports such as poly(ethylene terephthalate), can be subcoated with materials which aid adhesion to the support. A preferred class of subcoatings are polymers, copolymers and terpolymers of vinylidene chloride alone or with acrylic monomers such as acrylonitrile, methyl acrylate, etc., and unsaturated dicarboxylic acids such as itaconic acid, etc. The support can also carry a filter or antihalation layer composed of a dyed polymer layer which absorbs the exposing radiation after it passes through the radiation sensitive layer and eliminates unwanted reflection from the support. A yellow dye in a polymeric binder, such as one of the polymers referred to above as suitable subcoatings, is an especially effective antihalation layer when ultraviolet radiation is employed as the exposing radiation. The optimum coating thickness of the radiation sensitive layer will depend upon such factors as the use to which the coating will be put, the particular radiation sensitive polymer employed, and the nature of other components which may be present in the coating. Typical coating thicknesses for use in preparing resists can be from about 0.1 to 0.5 mils.

The radiation sensitive elements employed in the present invention can be imagewise exposed by conventional methods to a source of actinic radiation which is preferably a source which is rich in ultraviolet light. Suitable sources include carbon arc lamps, mercury vapor lamps, fluorescent lamps, tungsten filament lamps, lasers, and the like. The exposed elements can then be developed by flushing, soaking, swabbing, or otherwise treating the radiation sensitive layers with a solvent or solvent system which exhibits a differential solvating action on the exposed and unexposed materials. The unexposed areas of the coating will be removed by the solvent while the exposed areas will be unaffected. These developing solvents may be organic or aqueous in nature and will vary with the composition of the photographic layer to be developed. Exemplary solvents include tetrahydrofuran, chloroform, methylene chloride, methyl ethyl ketone, benzene, N,N-dimethyl formamide and the like. The resulting images may then be treated in any known manner consistent with their intended use such as treatment with desensitizing etches, plate lacquers, etc.

A preferred process for forming and treating the element comprises applying the photoresist solution to a clean surface to be etched by spraying, dipping, whirling etc., and air drying. If desired, a prebake of 10 to 15 minutes of 80° C is given to remove residual solvent and the coating is exposed through a pattern to a light source. The resist coating is then placed in a developer solvent such as an organic solvent, such as tetrahydrofuran, chloroform, and the like to remove unexposed areas. The developer can also contain dyes and/or pigments and hardening agents. The developed image is rinsed with distilled water, dried and optionally postbaked for 15 to 30 minutes at 80° C to 120° C. The substrate can then be etched by acid etching solutions such as ferric chloride.

The oxygen-substituted pyrrole of the polymers disclosed herein thermally rearrange to nitrogen-substituted moieties when exposed to higher temperatures of from about 200° C to about 300° C for 0.01 to 5.0 hours, as shown in Example 33 below.

The polymers of the present invention can be used advantageously in adhesive compositions, in photographic elements by reacting with dyes, as aids in the dyeing of fibers, as substrates for grafting with a wide variety of reagents, as crosslinking agents, as components of dry photographic products whereby an image is produced by thermal development, as topcoats, binders, etc. where a high glass transition temperature is desired.

The following examples of preparative methods are included to illustrate the production of materials useful in the practice of the present invention and to illustrate the best mode to produce the preferred polymers and radiation sensitive elements of the present invention. Glass transition temperatures were measured with a DuPont 990 Differential Scanning Calorimeter. Molecular weight data of the polymers were obtained by gel permeation chromatography in tetrahydrofuran at 23° C with a Waters M-100 Gel Permeation Chromatograph ($10^7$–$10^3$ columns). Infrared spectra were obtained with Perkin-Elmer Model 137 Sodium Chloride and Model 237B Grating Infrared Spectrophotometers. Inherent viscosities were determined at 25° C in chloroform at a concentration of 0.25 g of polymer in 100 ml of solution.

Preparation A — Preparation of 5-(1-adamantyloxy)-2H-pyrrole-2-one

A preferred maleimide monomer useful in the practice of the practice invention was prepared according to the following method as described by Schwartz and Lerner, *J. Org. Chem.*, 39 (1), 21–23 (1974).

A mixture of 1-bromoadamantane (3.2 g, 1.5 mmol), silver maleimide (3.2 g, 1.6 mmol), and benzene (80 ml) was stirred at room temperature for 18 hours. The resulting products of the reaction were separated by filtering off the silver bromide and by evaporating the filtrate to dryness to yield 3.4 g (98% of theoretical) of 5-(1-adamantyloxy)-2H-pyrrole-2-one.

Example 1 —
Poly[5-(1-adamantyloxy)-2H-pyrrole-2-one]

A polymerization catalyst, α,α′-azodiisobutyronitrile (0.012 g), was added to a solution of 5-(1-adamantyloxy)-2H-pyrrole-2-one (2.31 g, 0.01 mol) and chloroform (4.62 g). The solution was then maintained at 60° C in a nitrogen atmosphere. The reaction solution became thickened after 15 minutes of reaction. An additional 5 ml of chloroform were added and reaction was continued for another 45 minutes. At the end of this time, the solution was poured into ethyl ether (100 ml) to precipitate the resulting polymer. This polymer was collected, washed again with ethyl ether and dried in vacuo at approximately 60° C. The yield was 0.846 g (36.6% of theoretical). The inherent viscosity was determined to be 0.47 and the glass transition temperature (Tg) was determined on second heating to be 237° C. The polystyrene equivalent number average molecular weight ($\overline{M}n$), weight average molecular weight ($\overline{M}w$) and polydispersity index ($\overline{M}w/\overline{M}n$) were found to be 84,814; 200,063; and 2.36 respectively.

Example 2 —
Poly[5-(1-adamantyloxy)-2H-pyrrole-2-one-co-styrene] (50:50 molar ratio)

A polymerization catalyst, α,α'-azodiisobutyronitrile (0.017 g) was added to a solution of 5-(1-adamantyloxy)-2H-pyrrole-2-one (2.31 g, 0.01 mol), styrene (1.04 g, 0.01 mol) and dimethyl sulfoxide (25 ml) maintained at 60° C in a nitrogen atmosphere. After 2 hours of reaction, resulting polymer precipitated from the solution. The resulting mixture was poured into ethyl ether and allowed to stand for 2 hours. The polymer was then collected and dried in vacuo at approximately 60° C. The yield was 1.90 g (56.7% of theoretical). The glass transition temperature on second heating was found to be 245.5° C and the inherent viscosity was determined to be 0.55. The polystyrene equivalent number average molecular weight ($\overline{M}n$), weight average molecular weight ($\overline{M}w$) and polydispersity index ($\overline{M}w/\overline{M}n$) were determined to be 79,785; 159,029; and 1.99 respectively.

EXAMPLES 3–12 — Copolymerization of 5-(1-adamantyloxy)-2H-pyrrole-2-one with styrene or with methyl acrylate The monomers were copolymerized in various molar ratios (See Table I) by dissolving the monomers (0.02 total moles) in an appropriate amount of chloroform. The catalyst (α,α'-azodiisobutyronitrile) was added in the amount of 0.5 weight percent of total monomers. The resulting solutions were heated to and maintained at 60° C in a nitrogen atmosphere until such time as conversion was judged to be between 5 and 10 percent. The solutions were then diluted with 15 ml of chloroform and poured into 100 ml of ethyl ether with the aid of 10 ml additional chloroform wash. The ethyl ether was easily decanted from the resulting polymer and the polymer was again rinsed with ethyl ether, isolated and dried in vacuo at approximately 60° C.

Table I lists yields of the copolymers prepared in Examples 3–12 as well as feed ($M_2$) concentrations of the 5-(1-adamantyloxy)-2H-pyrrole-2-one moiety.

TABLE I
COPOLYMERIZATION OF 5-(1-ADAMANTYLOXY)-2H-PYRROLE-2-ONE WITH STYRENE AND METHYL METHACRYLTE

| Example (Comonomers) | $M_2$ | Time of reaction (min) | Conversion |
|---|---|---|---|
| 3 (Styrene) | 0.10 | 10 | 4.41 |
| 4 " | 0.20 | 10 | 9.21 |
| 5 " | 0.40 | 10 | 10.01 |
| 6 " | 0.60 | 10 | 8.65 |
| 7 " | 0.80 | 10 | 19.20 |
| 8 " | 0.90 | 8 | 12.04 |
| 9 (Methyl Methacrylate) | 0.20 | 10 | 2.61 |
| 10 " | 0.40 | 18 | 17.40 |
| 11 " | 0.60 | 10 | 12.40 |
| 12 " | 0.80 | 7 | 7.84 |

EXAMPLE 13 —
Poly[5-(1-adamantyloxy)-2H-pyrrole-2-one-comethyl methacrylate] (50:50 molar ratio)

A solution of 5-(1-adamantyloxy)-2H-pyrrole-2-one (2.31 g, 0.01 mol), methyl methacrylate (1.00 g, 0.01 mol), α,α'-azodiisobutyronitrile (0.017 g) and chloroform (6.62 g) was heated to and maintained at 60° C with nitrogen bubbling through. After 50 minutes of reaction, the solution was very viscous and additional chloroform (5 ml) was added. After a total reaction time of 2.5 hours, 10 ml of chloroform was added and the solution was poured into 150 ml of ethyl ether to precipitate the resulting polymer. The ethyl ether was decanted and the polymer was washed with ethyl ether, collected and dried in vacuo at 50° C. The yield of the polymer was 2.8 g (84.6% of theoretical). The glass transition temperature on second heating was found to be 233° C and the inherent viscosity was determined to be 1.05. The polystyrene equivalent number average molecular weight ($\overline{M}n$), weight average molecular weight ($\overline{M}w$) and polydispersity index ($\overline{M}w/\overline{M}n$) were determined to be 137,384; 452,973; and 3.30 respectively.

EXAMPLE 14 —
Poly[5-(1-adamantyloxy)-2H-pyrrole-2-one-co-2-hydroxyethyl methacrylate] (50:50 molar ratio)

Chloroform (10 ml) and α,α'-azodiisobutyronitrile (a portion of 0.018 g) were placed in a flask in a 60° C bath and a solution of 5-(1-adamantyloxy)-2H-pyrrole-2-one (2.31 g, 0.01 mol), 2-hydroxyethyl methacrylate (1.30 g. 0.01 mol), α,α'-azodiisobutyronitrile (the remaining portion of 0.018 g) and chloroform (11 ml) was added to the flask dropwise over a 40 minute period. The solution was then stirred for another 40 minutes, after which time, an additional 20 ml of chloroform was added to further dissolve polymer product. Stirring was continued for another 20 minutes until all polymer was dissolved. The resulting polymer was precipitated in 100 ml of ethyl ether, collected, washed in ethyl ether and dried in vacuo at about 50° C. The polymer yield was 1.0 g (27.7% of theoretical) and the polymer was soluble in tetrahydrofuran. The inherent viscosity of the resulting polymer was 0.96 and the glass transition temperature on second heating was 220° C.

EXAMPLES 15–21 — Copolymerization of 5-(1-adamantyloxy)-2H-pyrrole-2-one with selected comonomers Copolymers of 5-(1-adamantyloxy)-2H-pyrrole-2-one and selected comonomers were prepared according the following procedure: Bottles (4 oz.) were degassed with nitrogen and each charged with 5-(1-adamantyloxy)-2H-pyrrole-2-one (2.50 g. 0.0108 mol), a comonomer (See Table II, 0.0108 mol), 0.5 weight percent (based on total monomer weight) of α,α'-azodiisobutyronitrile and degassed chloroform (45.0 g or 60 weight percent based on total monomer weight). The bottles were sealed with tape and capped. The bottles were then swirled in a 60° C bath overnight. The next day, the contents of the individual bottles were poured into ethyl ether to precipitate the resulting polymers. The polymers were collected and dried in vacuo at 50° C. Inherent viscosity and yield data are tabulated in Table II.

TABLE II

| Example | Comonomer | Yield, % | Inherent Viscosity |
|---|---|---|---|
| 15 | Isobornyl methacrylate | 47.0 | 0.30 |
| 16 | Butyl methacrylate | 23.2 | 0.49 |
| 17 | Ethyl methacrylate | 70.1 | 0.41 |
| 18 | Acrylonitrile | 2.7 | 0.17 |
| 19 | Chloroethyl methacrylate | 80.5 | 0.57 |
| 20 | Acrylamide | 3.1 | 0.56 |
| 21 | Methyl vinyl ketone | 73.4 | 0.25 |

The following Examples 22-29 illustrate the photochemical reactivity of the polymers of the present invention. Exposure of those polymers to light causes the rearrangement of the oxygen-substituted maleimide moieties of the polymers to isocyanate and oxy-substituted cyclopropane moieties. As shown by the increase in infrared absorption in the isocyanate region of the infrared spectra, longer exposure to light produced more isocyanate groups in the polymers.

Example 22 — Photolysis of Poly[5-(1-adamantyloxy)-2H-pyrrole-2-one]

A sample of poly[5-(1-adamantyloxy)-2H-pyrrole-2-one] from Example 1 was dissolved in methylene chloride and coated onto a sodium chloride window plate. The coating was then air dried and covered with another window plate and mounted in an infrared spectrometer sample holder and irradiated with a General Electric 275 watt sunlamp. The Ir absorption increase at 2250 cm$^{-1}$ (isocyanate band) was determined to be 26.5 (% transmittance at 2250 cm$^{-1}$ - % transmittance at baseline) after 120 minutes of exposure. This example shows that, upon exposure to light, polymers containing oxygen-substituted maleimide moieties undergo rearrangement to form the crosslinkable polymers of the present invention having isocyanate and oxy-substituted cyclopropane moieties.

Example 23 — Photolysis of Poly[5-(1-adamantyloxy)-2H-pyrrole-2-one-co-styrene] (50:50 molar ratio)

A sample of a polymer prepared similar to that in Example 2 was coated and irradiated as in Example 22. After 75 minutes of irradiation, the Ir absorption increase at 2250 cm$^{-1}$ (isocyanate band) was 19 (% transmittance at 2250 cm$^{-1}$ — % transmittance at baseline; and after 1025 minutes, it was 51.

Example 24 — Photolysis of Poly[5-(1-adamantyloxy)-2H-pyrrole-2-one-co-methyl methacrylate] (50:50 molar ratio)

A sample of the polymer prepared in Example 13 was coated, exposed and evaluated as in Example 23. Table III lists the data obtained.

TABLE III

| Exposure Time (min) | Absorption Increase (absorbance at 2250 cm$^{-1}$ -absorbance of baseline) |
|---|---|
| 0 | 0 |
| 60 | 0.36 |
| 120 | 0.58 |
| 180 | 0.54 |
| 240 | 0.58 |

Example 25 — Photolysis of Poly[5-(1-adamantyloxy)-2H-pyrrole-2-one-co-methyl methacrylate] (50:50 molar ratio)

A sample (0.5 g) of polymer similar to that of Example 24 was dissolved in 10 ml. of tetrahydrofuran (freshly distilled and stored over molecular sieves) in a quartz tube with stirring. The solution was then irradiated with a 450 watt mercury vapor lamp through a distilled water-cooled quartz tube for 16.75 hours. A sample of the solution was then examined by infrared after coating and drying on a sodium chloride window plate. The absorption increase at 2280 cm$^{-1}$ (ratio of absorbance at 2280 cm$^{-1}$- baseline absorbance to absorbance at 3000 cm$^{-1}$ — baseline absorbance) was 0.73.

Example 26 — Photolysis of Poly[5-(1-adamantyloxy)-2H-pyrrole-2-one-co-2-hydroxyethyl methacrylate] (50:50 molar ratio)

A sample of poly[5-(1-adamantyloxy)-2H-pyrrole-2-one-co-2-hydroxyethyl methacrylate] (IV=0.17) was coated and treated as in Example 24. Table IV shows the data obtained.

TABLE IV

| Exposure Time (min.) | Absorption increase at 2250 cm$^{-1}$ (Absorbance at 2250 cm$^{-1}$- absorbance of baseline) |
|---|---|
| 0 | 0 |
| 120 | 0.40 |
| 180 | 0.61 |
| 360 | 1.28 |

Example 27 — Xenon Flash Photolysis of Poly[5-(1-adamantyloxy)-2H-pyrrole-2-one-co-methyl methacrylate] (50:50 mole ratio)

A sample of polymer prepared in Example 13 was dissolved in methylene chloride, coated onto a sodium chloride window plate, dried, covered with another salt plate and mounted in an infrared spectrometer sample holder. The sample was then exposed with xenon flashes (Xenon Corporation Model A power supply, two Xenon Corporation No. S625 lamps in series, 9.5 kv, 30µ farads capacitance, 56.4 joules/in input energy, 62 µsec per flash duration, rectangular Alzac reflector). Infrared examination after each exposure series gave the data listed in Table V.

TABLE V

| Exposure Flashes | Absorption Increase at 2260 cm$^{-1}$ (absorbance at 2250 cm$^{-1}$- absorbance at baseline) |
|---|---|
| 0 | 0 |
| 1 | 0.01 |
| 5 | 0.05 |
| 10 | 0.08 |

Example 28 and 29 — Xenon Flash Photolysis of Poly[5-(1-adamantyloxy)-2H-pyrrole-2-one-co-styrene] 50:50 mole ratio) and Poly[5-(1-adamantyloxy) 2H-pyrrole-2-one]

Samples of polymers similar to those prepared in Examples 1 and 2 were treated and exposed as in Example 27. Table VI lists the data obtained.

TABLE VI

| | ABSORPTION INCREASE AT 2250 cm$^{-1}$ (absorbance at 2250 cm$^{-1}$- absorbance of baseline) | | | |
|---|---|---|---|---|
| | Exposure Flashes | | | |
| Example | 0 | 1 | 5 | 10 |
| 28 (copolymer) | 0 | 0.01 | 0.04 | 0.07 |
| 29 (homopolymer) | 0 | 0.01 | 0.02 | 0.035 |

Example 30 — Photocrosslinking of Poly[5-(1-adamantyloxy)-2H-pyrrole-2-one-co-2-hydroxyethyl methacrylate] (50:50 molar ratio)

A sample of the polymer prepared in Example 14 was dissolved in tetrahydrofuran and coated onto a copper plate with a 4 mil coating blade and dried. The dried coating was partially covered with a black mask and irradiated with a 275 watt General Electric sunlamp for 1.5 hours. After the mask was removed, the coating was immersed in tetrahydrofuran for several minutes. The unexposed regions were dissolved in the solvent, leaving an image of crosslinked polymer in the exposed regions.

Example 31 — Photocrosslinking of Poly[5-(1-adamantyloxy)-2H-pyrrole-2-one-co-methyl methacrylate-co-2-hydroxyethyl methacrylate] (50:30:20 molar ratio)

Poly[5-(1-adamantyloxy)-2H-pyrrole-2-one-co-methyl methacrylate-co-2-hydroxyethyl methacrylate] (50:30:20 molar ratio) was prepared by the method of Example 14 with 5-(1-adamantyloxy)-2H-pyrrole-2-one (4.62 g., 0.02 mole), methyl methacrylate (1.20 g, 0.012 mole), 2-hydroxyethyl methacrylate (1.04 g. 0.008 mole), α,α'-azodiisobutyronitrile (0.034 g.) and chloroform (40 ml.). The polymer yield was 3.0 g. (43.7% of theoretical). The inherent viscosity of the resultant polymer was 0.56. A sample (0.5 g.) of this polymer was treated as in Example 30 with an exposure time of 1.33 hours. The unexposed regions were dissolved in tetrahydrofuran, leaving crosslinked polymer in the exposed regions.

Example 32 — Crosslinking of photolyzed poly[5-(1-adamantyloxy)-2H-pyrrole-2-one-co-methyl methacrylate] (50:50 molar ratio) with 1,4-Bis(amino methyl)cyclohexane A sample (5.0 g.) of poly[5-(1-adamantyloxy)-2H-pyrrole-2-one-co-methyl methacrylate] (50:50 molar ratio) was dissolved in 50 ml. of dry tetrahydrofuran in a quartz flask with stirring. The resulting reaction solution was then irradiated with a 450 watt mercury vapor lamp through a distilled water-cooled quartz jacket for 24 hours. An infrared spectrum was obtained of a film of the polymer cast from the reaction solvent showing a strong absorption at 2280 cm$^{-1}$. A sample (4.0 g.) of the reaction solution was treated with 5 drops of 1,4-bis-(aminomethyl)cyclohexane, causing immediate gelation. Ethyl ether was added to the gelled material and the resulting crosslinked polymer was collected and dried. The yield was 0.5 g. The crosslinked polymer was insoluble in methylene chloride. An infrared spectrum of the crosslinked polymer showed no trace of absorption at 2280 cm$^{-1}$ (isocyanate band).

Example 33 — Thermolysis of selected polymers

A sample of the polymer of Example 1 was placed in a vial and heated under an atmosphere of nitrogen at 276° C for 3.33 hours. Infrared spectrum of the resulting polymer showed that the adamantyl groups had moved from the oxygen atoms to the nitrogen atoms of the pyrrole rings. Table VII lists the peak temperature values observed for this thermal arrangement for selected polymers upon analysis by differential scanning colorimetry on first heating.

TABLE VII

| Example Polymer | Peak Temperature of Exotherm ° C |
| --- | --- |
| 1 | 241 |
| 2 | 248 |
| 13 | 246 |

TABLE VII-continued

| Example Polymer | Peak Temperature of Exotherm ° C |
| --- | --- |
| 14 | 196 |

Example 34 — Preparation of poly[5-(1-adamantyloxy)-2H-pyrrole-2-one-co-styrene] using benzoyl peroxide as catalyst Styrene (1.13 g., 0.011 mol), 5-(1-adamantyloxy)-2H-pyrrole-2-one (2.5 g., 0.011 mol) and chloroform (14.5 g.) were added to a 100 ml. flask. This solution was purged with nitrogen, covered with a nitrogen blanket and heated to 55° C. The initiator, benzoyl peroxide (0.018 g.), and then added to the solution and polymerization was allowed to proceed overnight. The resulting polymer was precipitated into ethyl ether, collected and dried in vacuo at 45° C. The yield was 3.0 g (83% of theoretical) and the inherent viscosity was determined to be 0.49.

Example 35 — Preparation of poly[5-(1-adamantyloxy)-2H-pyrrole-2-one-co-styrene] in dioxane Styrene (2.25 g., 0.022 mol) and 5-(1-adamantyloxy)-2H-pyrrole-2-one (5.0 g., 0.022 mol) were polymerized in dioxane (29 g.) using α,α'-azodiisobutyronitrile (0.036 g.) as initiator and the procedure of Example 34. The resulting polymer yield was 5.7 g. (79% of theoretical) and the inherent viscosity was 0.59.

The invention has been described in detail with particular reference to preferred embodiments thereof, but it will be understood that variations and modifications can be effected within the spirit and scope of the invention.

What is claimed is:

1. A radiation sensitive polymer comprising
  A. from about 1 to 100 mole percent of a polymerized monomer having the formula

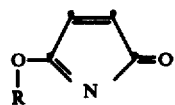

and polymerized through the ethylenically unsaturated bond wherein R is selected from the group consisting of alkyl, cycloalkyl, aryl each having from 2 to 20 carbon atoms, and bridged hydrocarbon groups having from 6 to 10 carbon atoms; and
  B. from 0 to about 99 mole percent of one or more polymerized ethylenically unsaturated monomers.

2. The polymer of claim 1 wherein R is a bridged hydrocarbon group having from 6 to 10 carbon atoms.

3. The polymer of claim 1 wherein the polymer has an inherent viscosity in the range of 0.2 to 3.0.

4. The polymer of claim 1 wherein at least one of the additional polymerized ethylenically unsaturated monomers is selected from the group consisting of acrylamide, acrylonitrile, isobornyl methacrylate, butyl methacrylate, chloroethyl methacrylate, methyl vinyl ketone, methyl methacrylate and styrene.

5. The polymer of claim 1 wherein R is 1-adamantyl.

6. The polymer of claim 1 having a glass transition temperature greater than about 200° C on second heating.

* * * * *